(12) United States Patent
Seibold

(10) Patent No.: US 7,640,474 B2
(45) Date of Patent: Dec. 29, 2009

(54) SYSTEM AND METHOD FOR INPUT/OUTPUT CHARACTERIZATION

(75) Inventor: John J. Seibold, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 11/962,297

(22) Filed: Dec. 21, 2007

(65) Prior Publication Data

US 2009/0164856 A1 Jun. 25, 2009

(51) Int. Cl.
*G01R 31/28* (2006.01)
(52) U.S. Cl. ...................................... 714/727
(58) Field of Classification Search ........................ None
See application file for complete search history.

(56) References Cited

U.S. PATENT DOCUMENTS

| | | | |
|---|---|---|---|
| 5,812,562 A | 9/1998 | Baeg | |
| 6,266,801 B1 * | 7/2001 | Jin | 716/8 |
| 6,374,380 B1 * | 4/2002 | Sim | 714/727 |
| 6,578,168 B1 * | 6/2003 | Parulkar et al. | 714/727 |
| 6,760,873 B1 | 7/2004 | Hao et al. | |
| 7,269,769 B2 * | 9/2007 | Whetsel | 714/726 |
| 2003/0188243 A1 | 10/2003 | Rajan | |

* cited by examiner

*Primary Examiner*—Christine T Tu
(74) *Attorney, Agent, or Firm*—Dawn V. Stephens; Wade James Brady, III; Frederick J. Telecky, Jr.

(57) ABSTRACT

A test system in an integrated circuit includes a boundary scan cell. The boundary scan cell includes a first storage element and a second storage element connected in series with the first storage element. The boundary scan cell also includes initialization logic connected between an output of the first storage element and an input of the second storage element. The initialization logic provides the output of the first storage element to the input of the second storage element unchanged during a first operating state, and provides an inverted version of the output of the first storage element to the input of the second storage element during a second operating state. A bi-directional element is connected to receive an output of the second storage element, the bi-directional element feeding the output of the second storage element to an input of the first storage element, such that capture of a state change at the output of the first storage element at the output of the first storage element is facilitated during the second operating state.

20 Claims, 6 Drawing Sheets

SYSTEM AND METHOD FOR INPUT/OUTPUT CHARACTERIZATION

TECHNICAL FIELD

This invention relates to electronic circuits, and more specifically to a system and method for input/output characterization of an integrated circuit.

BACKGROUND

Many approaches have been developed to test and verify interconnects and functionality of integrated circuits (ICs). Existing testing can utilize circuitry external to an IC for a various types of testing, circuitry internal to the IC, or a combination of internal and external circuitry and test equipment.

For example, ICs can be tested both before and after they are assembled into packages (e.g. dual-in-line packages or DIPs, leadless chip carriers or LCCs, pin grid arrays, quad flat packs, etc.). Before assembly into a package, ICs can be probed by special machines utilizing special probe cards and test vectors which consist of sets of input signals, output signals and bidirectional signals. These test vectors are used to provide information to the probe machine such that the IC can be electrically stimulated and verified. Each vector contains a set of input signals (stimulus) and a set of output signals which are verified by the probe machine after application of the input stimulus for each test vector. Once the preassembled ICs are verified to be functional, they are assembled into a packaged part and retested using similar types of apparatuses, which is now equipped with a socket instead of a set of probes. The same set of test vectors is utilized to verify post assembly operation.

As a further example, IEEE standard 1149.1 (also known as the Joint Test Action Group (JTAG) Standard) establishes a boundary scan implementation for IC interconnect testing. The JTAG standard is a scan-based architecture disposed on the IC under test as a part of the circuitry. Such an IC includes a scan input (receives serial data at an input pin) and a scan output (receives serial data from the ASIC at an output pin). Integrated circuits have increasingly incorporated the JTAG (Joint Test Action Group) test port to facilitate testing and debug of integrated circuit chips mounted on a board. The JTAG standard can be utilized in verification of both the ASICs and board level interconnect after the IC has been mounted onto a circuit board.

Under normal operating conditions, the boundary scan cells simply let the input/output signals pass through them, into and out of the I/O pins. When the device is placed into a 'Test' mode, however, these boundary scan cells become 'active' to enable the capture or control of the signals propagating into and out of the IC, effectively circumventing the device's normal input and output connections.

SUMMARY

One aspect of the invention relates to a test system in an integrated circuit, which includes a boundary scan cell. The boundary scan cell includes a first storage element and a second storage element connected in series with the first storage element. The boundary scan cell also includes initialization logic connected between an output of the first storage element and an input of the second storage element. The initialization logic provides the output of the first storage element to the input of the second storage element unchanged during a first operating state, and provides an inverted version of the output of the first storage element to the input of the second storage element during a second operating state. A bi-directional element is connected to receive an output of the second storage element, the bi-directional element feeding the output of the second storage element to an input of the first storage element, such that capture of a state change at the output of the first storage element at the output of the first storage element is facilitated during the second operating state.

Another aspect of the invention relates to a test system in a JTAG-compliant integrated circuit. The test system includes a first storage element and a second storage connected in series with the first storage element. A bi-directional element is connected between an output of the second storage element, the bi-directional element feeding an output of the second storage element to an input of the first storage element. Initialization logic is connected between the first storage element and the second storage element. The initialization logic is configured to pass the output of the first storage element to the input of the second storage element during a first operating state and being configured to provide an inverted version of the output of the first storage element to the input of the second storage element during a second operating state. A clock shaping system is configured to provide an output clock signal to control shifting data through at the first and second storage elements. The output clock signal corresponds to a test clock signal having a substantially fixed duty cycle during the first operating state and the output clock signal corresponding to the test clock signal having one of a selectively adjustable rising edge or falling edge during the second operating state to enable capture of a state change at the output of the first storage element during the second operating state.

Still another aspect of the invention relates to a method for input/output characterization of a JTAG-compliant integrated circuit. The method includes initializing at least a first storage element and a second storage element to a starting value, the first storage element and the second element being connected in series between an input and an output of boundary scan cell. An output of the first storage element is inverted and the inverted output is provided to an input of the second storage element in response to entering a predefined test mode. An output of the second storage element is fed back to an input of the first storage element. A test clock signal is incrementally adjusted during the predefined test mode and a state change at the output of the first storage element is captured in response to the incrementally adjusted test clock signal causing the inverted output of the first storage element to be fed back from the second storage element within one cycle of the test clock signal.

DETAILED DESCRIPTION

The invention relates to electronic circuits, and more specifically to a system and method for input/output (I/O) characterization for an integrated circuit (IC). The systems and methods described herein can be implemented at relatively low cost in a JTAG-compliant IC. For instance, the IC typically includes a plurality of boundary scan cells, each including at least first and second storage elements (e.g., latches or flip-flops) connected together, such as an arrangement of multiplexed shift registers. Initialization logic can be connected between an output of the first storage element and an input of the second storage element to enable an inverted version of the output of the first storage element to be provided to the input of the second storage element during a predefined operating state, such as can be designed to perform speed testing for a boundary scan cell. A bi-directional element can be configured to feed the output of the second storage element to an input of the first storage element to enable the inverted version of the output to propagate through first storage element. In this way, the inverted version of the output of the first storage element can be captured at the output of the first storage element. Additionally, a clock shaping system can be implemented to provide an output test clock signal having an incrementally adjustable rising edge (e.g., by delaying a test clock signal) during the predefined operating state, which output test clock signal can be used to control propagating signals through the storage elements during the speed test such that the inverted version of the can be captured within one test clock cycle.

Figure 1:
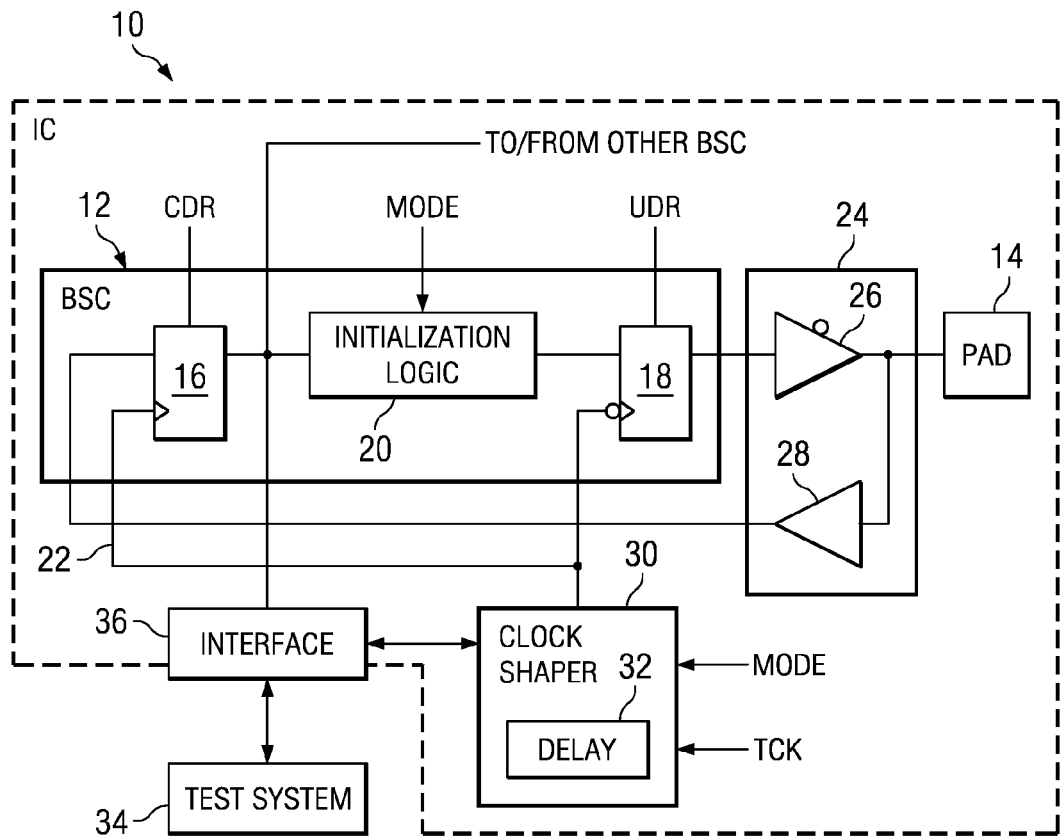
FIG. 1 illustrates an example of a test system for an IC in accordance with an aspect of the invention.

FIG. 1 illustrates an example of a system 10 for performing I/O characterization and testing of an IC according to an aspect of the invention. The system 10 includes one or more boundary scan cells (BSC) 12, such as can be connected between core logic (not shown) and an input or output pad 14 of the IC. The BSC 12 includes at least two storage elements 16 and 18 connected in series within the BSC. The storage elements can be implemented as a latch, such as in the form of a D flip-flop or other type of circuitry capable of storing and shifting the state of at least one bit in response to a clock signal 22, such based on a test clock signal (TCK).

The BSC 12 also includes initialization logic 20 electrically connected between the storage elements 16 and 18. In particular, an output of the first storage element 16 is provided to the initialization logic 20 and an output of the initialization logic is provided to an input of the second storage element. The initialization logic 20 passes either the output of the storage element 16 or an inverted version thereof to the input of the second storage element based on the state of a MODE signal. A predefined instruction can be programmed to initiate and control the operating state of the system 10 via the MODE signal for performing a corresponding test. For instance, in JTAG-compliant IC, an at speed test capture (ASCAP) instruction can be added to the standard JTAG instruction set to control operation of one or more boundary scan cell or an entire boundary scan chain for performing speed testing according to an aspect of the invention. Thus, the MODE signal can be provided with a state (e.g., a digital value or one or more bits) that indicates the ASCAP instruction has been loaded into an instruction register during a run test idle state of the JTAG state machine.

A bi-directional element 24 receives the output of the second storage element 18. In the example of FIG. 1, the bi-directional element is configured to drive the pad 14 with an output signal corresponding to the output from the storage element 18 and concurrently feed the output signal to an input of the first storage element 16. For instance, the bi-directional element can replace an input only pad or an output only pad of an IC to enable characterization and speed testing described herein. The bi-directional element 24 can include a pair of buffers (e.g., drivers) 26 and 28, one buffer 26 being connected to pass the signal from the BSC 12 to the pad and the other being connected to drive an input of a respective storage element 16 of the BSC. Thus, the bi-directional element 24 forms a loop with the BSC 12 for cycling data through the BSC 12 to allow speed testing and other I/O characterization to be performed.

The system 10 can also include a clock shaper 30 that provides the output clock signal 22 to at least the BSC 12. In a JTAG-compliant IC, clock signal 22 can be provided to the entire boundary scan chain. The clock shaper 30 provides the clock signal 22 in response to the test clock (TCK) signal and the MODE signal. For instance, the clock shaper 30 can provide the output clock signal 22 as either the TCK signal or as delayed version of the TCK signal depending on the MODE signal. During a first operating state (e.g., not corresponding to an ASCAP mode), for example, the clock shaper 30 can selectively provide the output clock signal 22 as an unmodified version of the TCK signal. The clock shaper 30 can include a delay network 32 that can be activated based on the MODE signal to implement an incremental amount of delay on an inverted TCK signal. The amount of delay can be selectively adjusted for providing the delayed version of the inverted TCK signal, which defines the rising edge of the output clock signal 22 during the second operating state. The amount of delay can be adjusted (e.g., increased or decreased) during a test cycle, such as to ascertain an amount of time required for propagating a signal through the input or output path that includes the BSC 12.

To measure the propagation time or other test parameters a test system 34 can be coupled to the system through an interface 36 implemented in the IC. For the example of a JTAG-compliant IC, the interface can be a standard JTAG interface, such as a test access port (TAP) interface configured to communicate with the BSC. In such example, the test system 34 can measure data from the BSC 12 and/or from the clock shaper 30 via the TDO of the JTAG interface. The test system 34 can also control the clock shaper 30 via the TDI of the JTAG interface. To help reduce manufacturing costs, the test system 34 can be implemented as part of test equipment external to the IC. The test system 34 thus can initiate the test via the interface 36, set a desired value into the storage elements, adjust the delay to provide the output test clock signal and monitor the output of the first storage element 16. As the amount of delay is varied, the test system 34, in response to detecting a state change at the output of the storage element 16, can determine the propagation time for a signal through the BSC 12 and the bi-directional element. It will be appreciated that the delayed version of the TCK clock signal at 22 enables the test system 34 to capture the state change within a single TCK clock cycle (one TCK period).

Figure 2:
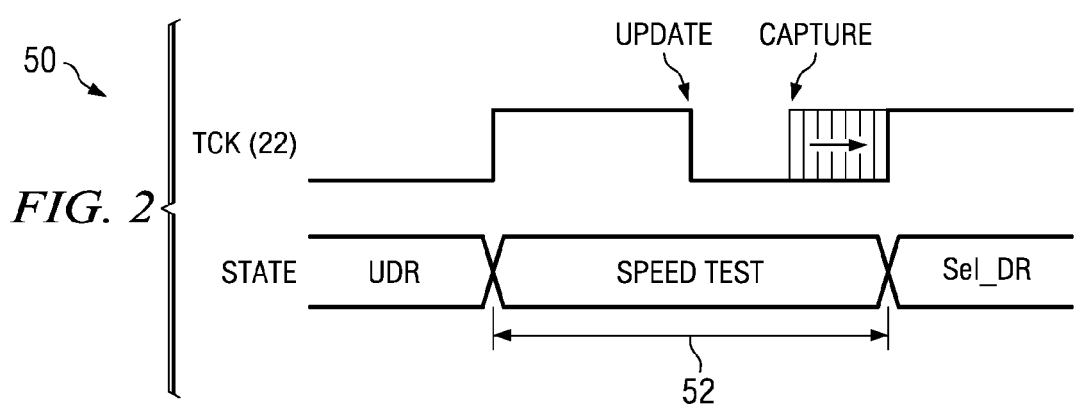
FIG. 2 is a timing diagram illustrating the relationship of certain signals during a test implemented in accordance with an aspect of the invention.

The capture of the state change at the output of the first storage element 16 of FIG. 1 will be better appreciated with reference to the timing diagram 50 of FIG. 2, which demonstrates the relationship between the output clock signal 22 (FIG. 1) and the state of the system 10 for a JTAG-compliant IC. It will be understood that prior to performing a speed test (e.g., via an ASCAP instruction), that a selected value (e.g., 0 or 1) is loaded into the storage elements 16 and 18. The state machine enters an update-DR (UDR) state until the rising edge of the output clock signal 22, at which time the speed test is entered.

For example, the speed test state can be entered whenever the corresponding test instruction (ASCAP) is loaded into the instruction register while the run/test idle (RTI) state of the state machine is asserted (e.g., high). Due to operation of the initialization logic 20, an inverted version of the output of the storage element 16 is provided at the input of the second storage element 18. This inverted version of the output of the first storage element 16 is latched to the output of the storage element 18 at the falling edge of the output clock signal (indicated in FIG. 2 as 'UPDATE'). The bidirectional element 24 feeds the output to the input of the first storage element 16. The first storage element 16 is configured to capture its input at the rising edge of the output clock signal 22. Thus, the output of the storage element 16 will change states (either from 0 to 1 or from 1 to 0, depending on how it was initially loaded) at a time when the rising edge of the output clock signal is substantially coincident with the inverted version of the output signal arriving at the input the first storage element 16. Thus, the test system 34 can monitor or measure the output of the first storage element 16 to for a given output clock signal determine if the I/O passes or fails. A pass can result when a state change is detected at the output and a fail correspond to no state change. Therefore, a TCK signal, which is slower than a normal at speed clock for the IC, can be used to characterize an I/O of the IC based on the amount of time required to capture a state change at the output. For example, the test can be repeated for a plurality of different delay values that selectively vary the rising edge of the output clock signal 22. The delay value that transitions from a pass to a fail (or from a fail to a pass) can be used to identify a minimum amount of time required for propagating signals at a given I/O. The actual amount of time can be tracked by the test system 34 or it can be derived from the amount of delay implemented by the delay network. As mentioned above, this determination of whether an I/O passes (or fails) can be made within a single TCK cycle or period, indicated at 52. It will be appreciated that such aggregate testing can be implemented with relatively small cost of modifying a standard JTAG architecture. The I/O characterization can be performed for any one or more selected pin of the IC. Measurement may require multiple trials for each delay value to determined pass or fail status.

Figure 3:
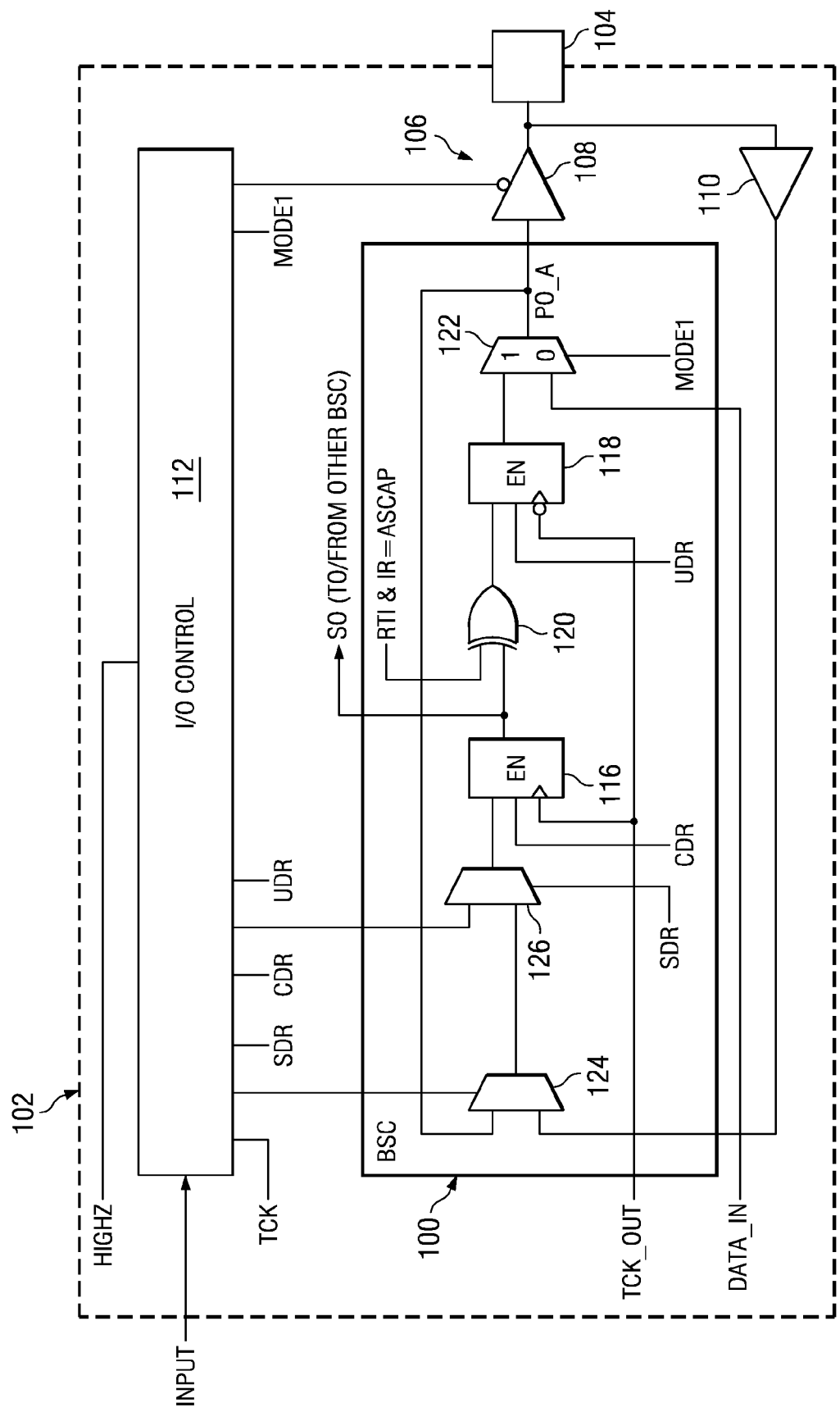
FIG. 3 illustrates an example of a boundary scan cell architecture that can be implemented in accordance with an aspect of the invention.
Figure 6:
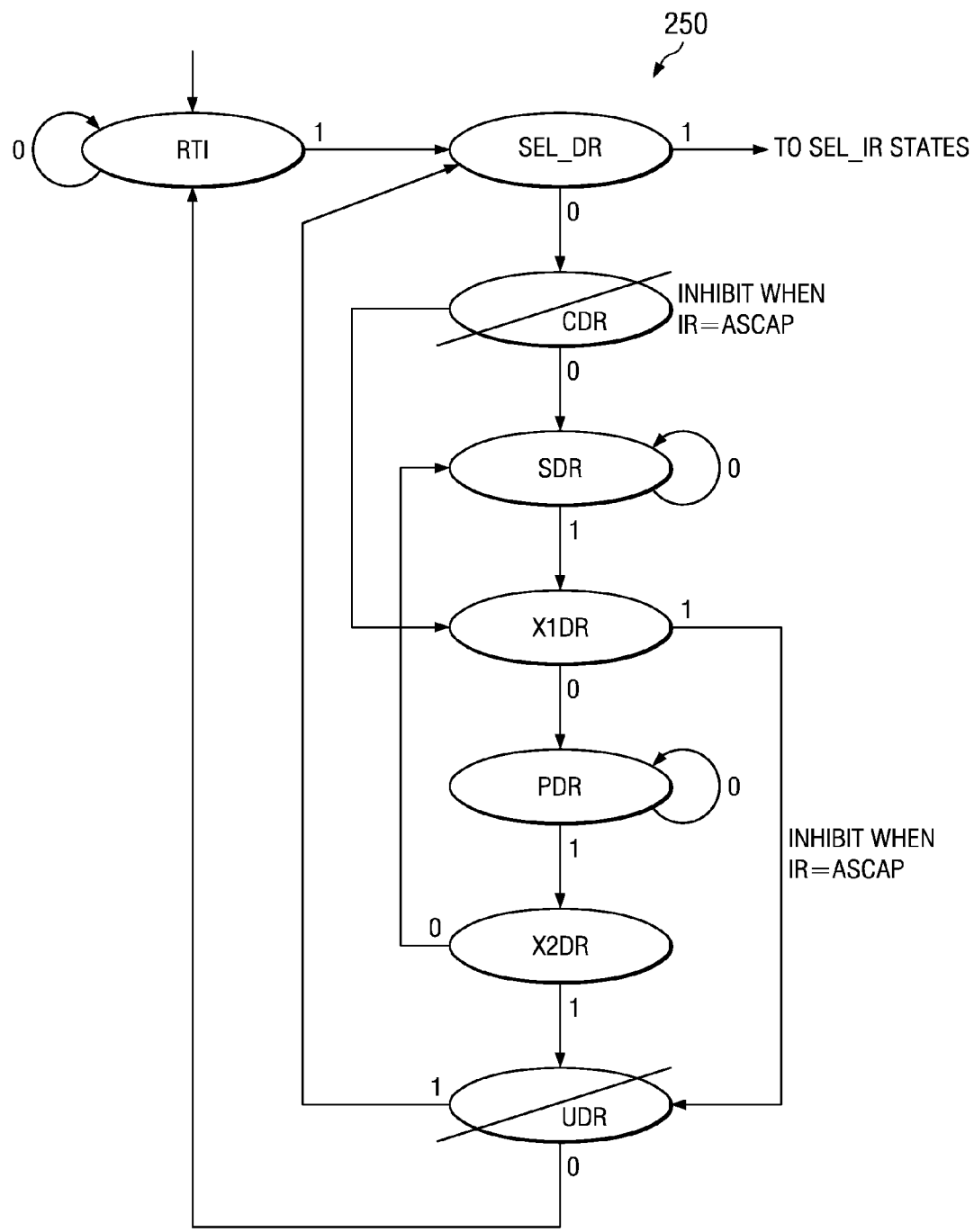
FIG. 6 illustrates an example of a state diagram for a JTAG-compliant device implementing a test in accordance with an aspect of the invention.

FIG. 3 depicts an example of a BSC 100 that can be implemented in a JTAG-compliant IC, schematically indicated by a dashed line at 102, according to an aspect of the invention. The BSC 100 includes an arrangement of multiplexers and flip-flops arranged to control propagation of signals through the BSC in manner that varies based on whether the IC 102 is operating in a JTAG test mode and the state of the test mode. An example of the JTAG states is shown in FIG. 6. The BSC 100 is coupled with a pad 104 through a bidirectional element 106. The bidirectional element 106 can include a pair of buffers (e.g., drivers) 106 and 108. For instance, one buffer 108 is connected to pass the signal from the BSC 100 to the pad and the other buffer 110 is configured to feedback the signal from the output of the buffer 108 at the pad 104 to an input of the BSC.

The IC 102 also includes an I/O control block 112 that is associated with the BSC 100. The I/O control block 112 can be configured to control the bidirectional element 106 as well as to control operation of the BSC 100. The I/O control block 112, for example, can vary the control based on a state of the JTAG state machine, such as can be defined register values, including a shift-data register (SDR) state, a capture-data register (CDR) state and a update-data register (UDR) state. The timing of such control can be established of the JTAG TCK signal. The I/O control block 112 can also receive an INPUT signal that can be shifted into the BSC. The INPUT signal, for example, can be provided from TDI or it can be provided from a preceding BSC in a scan chain, such as where the BSC 100 is not the first BSC in the chain. Additionally, the operation of the I/O control block 112 can depend on a given operating mode, such as defined by a MODE1 signal, which (in FIG. 3) the MODE1 signal can indicate whether the IC 102 is in a test mode in which the JTAG functionality is enabled or a normal IC operating mode in which the JTAG functionality is disabled.

In the example of FIG. 3, the BSC 100 includes a pair of flip-flops (FFs) 116 and 118 connected in series. Each of the FFs 116, 118 is activated to latch (or shift) its input to its respective output based on the output test clock (TCK_OUT) signal. For example, FF 116 is configured to shift its input to its output on a rising edge of TCK_OUT and the FF118 is configured to shift its input to its output on a falling edge of TCK_OUT. It will be appreciated that other clocking schemes can be utilized, such as a scheme that might violate the JTAG standard. Initialization logic in the form of an Exclusive-OR (XOR) gate 120 is connected between the FFs 116 and 118. The output of FF 116, indicated at SO, is coupled to a first input of the XOR gate 120 and a logic signal, which is defined by the state machine and the value of an instruction register, is provided to the other input of the XOR gate. For instance, the logic signal is asserted (e.g., logic 1 or high) when the instruction register of the JTAG system is loaded with the ASCAP instruction while the RTI state is asserted (high). Thus, when the logic signal is high (RTI & IR=ASCAP), the XOR gate provides an inverted version of the output of the FF 116 to the input of FF 118. Those skilled in the art will understand and appreciate that other logic, combinational logic (e.g., multiplexer) or other circuitry can be employed to invert the output of the FF 116 according to an aspect of the invention.

An output multiplexer 122 is connected between the FF 118 and the bi-directional element 106. The multiplexer 122 provides a corresponding output signal based on the MODE1 signal. For example, the multiplexer 122 can pass the output of the FF 118 to the buffer 108 of the bi-directional element 106 when the MODE1 signal has a first state (e.g., 1, corresponding to a test mode). Alternatively, the multiplexer 122 can pass a DATA_IN signal, such as corresponding to an output from core logic (not shown) of the IC 102, when the MODE1 signal has a second state (e.g., 0, corresponding to a normal IC operating mode). The buffer 108 drives the output of the multiplexer 122 to the pad 104.

The buffer 110 of the bi-directional element 106 further feeds back such output to an input of the BSC 100. In the example of FIG. 3, the buffer 110 provides the output to an input of a multiplexer 124. The output of the multiplexer 122, corresponding to the input to the buffer 108, is provided as a second input to the multiplexer 124. The I/O control block 112 provides a control signal to select one of the inputs of the multiplexer 124, which selection may vary according to the MODE1 signal and other logic performed within the I/O control. The multiplexer 124 provides its output to an input of another multiplexer 126. The multiplexer 126 also receives an input signal from the I/O control, such as may correspond to or be derived from the INPUT signal, for example. The state of the SDR signal selects which of the inputs the multiplexer provides at the input of the FF 116.

Thus, with a proper set of states during the test mode (e.g., MODE1=1 and RTI & IR=ASCAP), the FF 116 will be activated to enable detection of a state change at its output SO, which can be measured to characterize timing of the I/O path through the BSC and the bi-directional element 106. As described herein, an inverted TCK signal can be incrementally delayed during a test cycle to provide an incrementally variable rising edge of the TCK_OUT signal to ascertain timing requirements to enable capture of the inverted version of the FFs 116 output (as inverted by the XOR gate 120) at the output SO. This control of the rising edge can be performed by a clock shaper, such as shown and described herein. By controlling the amount of delay to be much less than TCK cycle, the capture of the inverted test signal can be performed in less than one TCK cycle. The resolution and accuracy of this characterization may vary depending on how the incremental delay for the TCK_OUT signal is implemented.

Figure 4:
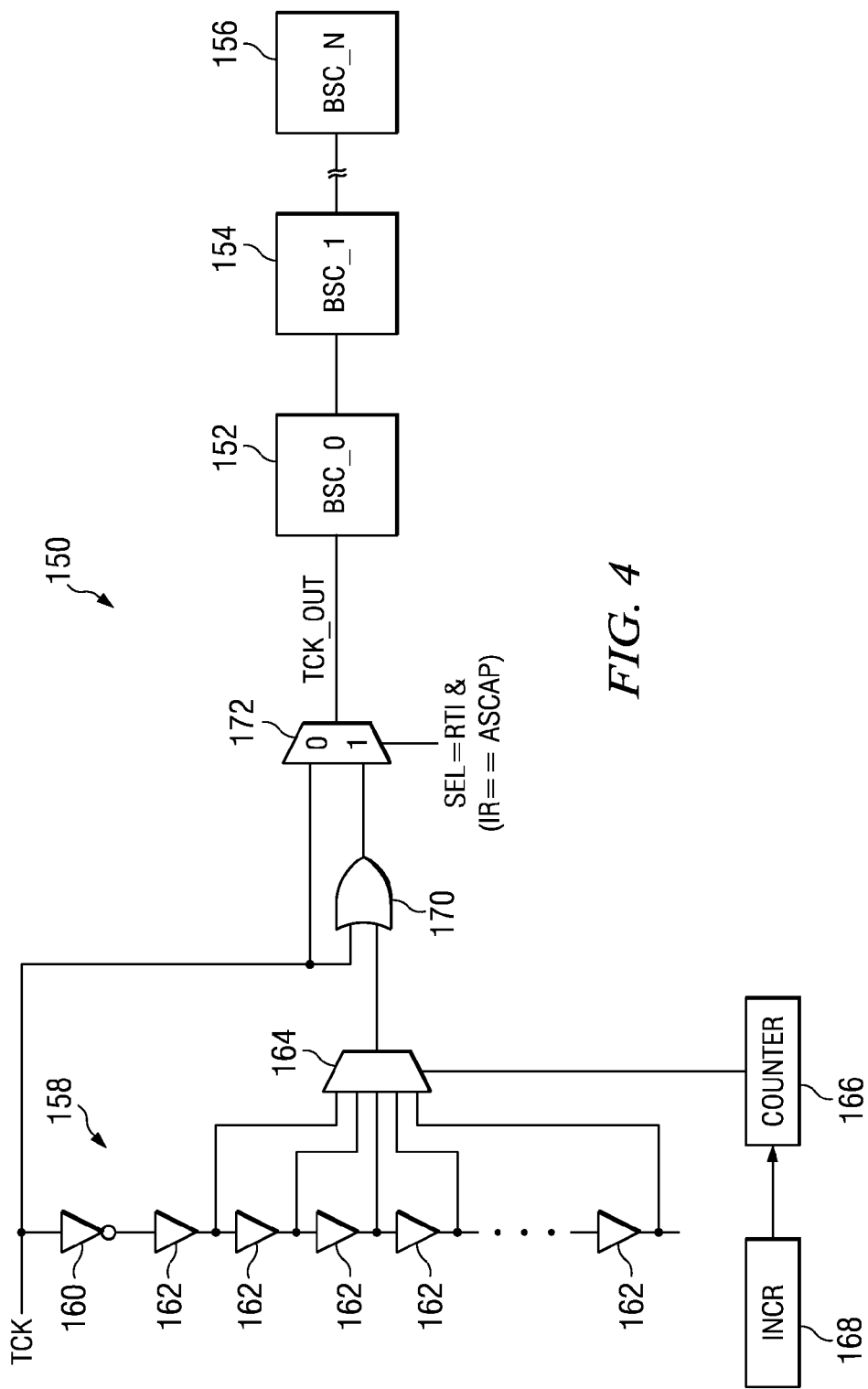
FIG. 4 illustrates an example of a clock shaping system that can be utilized in a test system in accordance with an aspect of the invention.

FIG. 4 depicts an example of a clock shaper 150 that can be utilized to delay an inverted version of the TCK signal, depicted as TCK_OUT. The clock shaper 150 can provide the TCK_OUT signal to a scan chain of N boundary scan cells 152, 154 and 156, which collectively form a boundary scan register of an IC (where N is a positive integer N>1 denoting the number of boundary scan cells). In the example of FIG. 4, the TCK signal is provided to an input of a delay line 158, which includes an inverter 160 serially connected with a plurality of buffers 162. The output of each buffer 162 can be provided to a respective input to a multiplexer 164. Each buffer 162 implements a known amount of delay, which may be the same or different, on the inverted version of the TCK signal, such that each buffer output produced a selectable rising edge that can be provided as the rising edge of the TCK_OUT signal. A delay selection signal can be provided to select a desired amount of delay for the inverted version of TCK. As one example, a counter 166 can be incremented (e.g., up or down) to a value that defines the amount of delay for the inverted TCK signal according to which multiplexer input is selected. Those skilled in the art will appreciate various ways to increment the counter 166. For example, an increment register 168, such as an existing JTAG register, can be provided set to a value to increment in the counter value, which can be to increase or decrease the value. Alternatively, the counter can be incremented manually (in response to user selection) or automatically, such as via an IC pin coupled to an external test device. The counter 166 may be adjusted by any number of one or more count values for each increment. The amount of delay associated with the delay line 158 can be ascertained by employing a ring oscillator connected to the delay line.

The multiplexer 164 provides an output signal corresponding to an inverted TCK signal having a selected amount of delay to an OR gate 170. The OR gate performs a logical ORing function of the multiplexer output with the TCK signal to an input of another multiplexer 172. The inverted version of TCK thus provides the rising edge of the TCK_OUT signal. The TCK signal also is provided to another input of the multiplexer 172. The multiplexer 172 provides the TCK_OUT signal to the scan chain based on a selection signal. The selection signal has a value that depends on the state of the JTAG state machine and on what test instruction is loaded in the JTAG instruction register. For example, the delayed, inverted version of TCK is provided as the TCK_OUT signal from the multiplexer 172 if the ASCAP instruction is loaded in the JTAG instruction register while the RTI state is asserted. Otherwise, the multiplexer 172 provides the TCK_OUT signal as the TCK signal (not modified). Those skilled in the art will understand and appreciate other configurations of clock shaper circuitry that can be utilized to provide a variable rising edge for a TCK signal. Alternatively, a variable rising edge of the TCK_OUT signal could be provided from other clock generating circuitry (e.g., internal or external to the IC), such as during the test mode, to enable speed testing according to an aspect of the invention.

Figure 5:
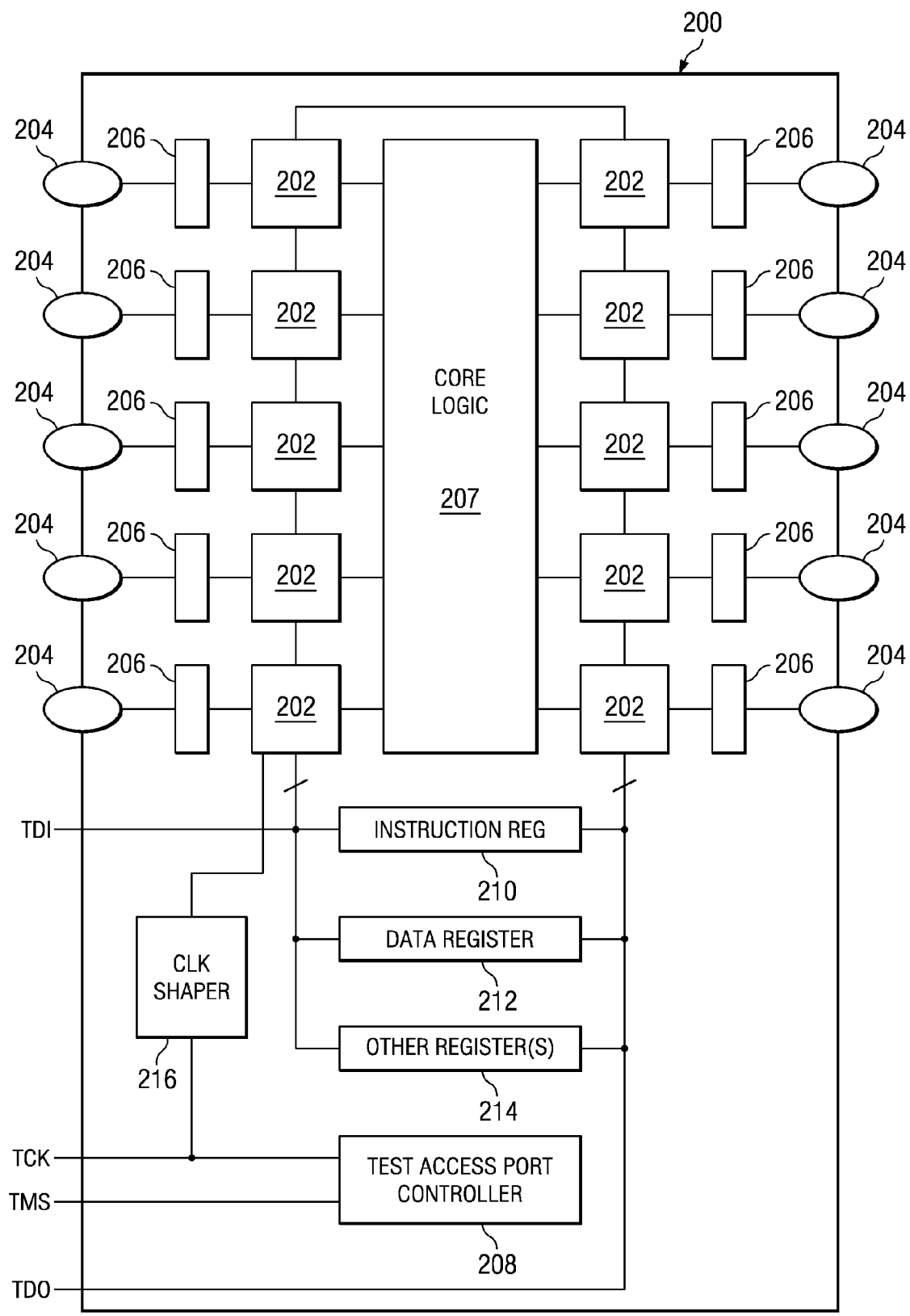
FIG. 5 depicts an example of a JTAG-compliant IC that can be implemented according to an aspect of the invention.

FIG. 5 depicts an example of a JTAG-compliant IC 200 that can be configured to perform testing, such as speed testing and I/O characterization, according to an aspect of the invention. The JTAG-compliant IC 200 includes a plurality of BSCs 202, such as one for each of a plurality of I/O pins 204. Each BSC 202 is coupled to its respective PIN through a bi-directional element 206. Each BSC 202 is also connected to core logic 207 of the IC (e.g., application specific logic and other functional circuitry). A 'scan path' or 'scan chain' connects the BSCs 202 together in a serial manner. The IC 200 also includes an interface (e.g., a test access port (TAP)) that can include a plurality of additional I/O pins to handle the JTAG signals for controlling and monitoring boundary scan testing. The interface can include a test data input (TDI) pin, a test mode signal (TMS) pin, a TCK pin, and a test data output (TDO) pin. The IC 200 also includes a TAP controller or state machine 208 that controls the states of operation of the boundary-scan testing. The TMS and TCK pins are used to control transitions between states, such as will vary depending on the data in the registers 210, 212 and 214.

During a normal operating mode, the BSCs 202 simply let the I/O signals pass through into and out of the I/O pins 204. When the device is placed under a 'Test' mode, the boundary cells become 'active' for use in the direct capture or control of the signals going into and out of the I/O circuitry of the IC 200, circumventing the device's normal input and output connections. Each BSC 202 can include a set of multiplexed shift-registers that are located around the IC's periphery, such as can be configured as shown and described with respect to FIGS. 1 and 3. The TDI pin is a serial data input to the JTAG instruction register 210, the user data register 212 and one or more other registers 214 that can be utilized in a JTAG-compliant device. The state of the TAP controller 208 as well as the particular instruction held in the instruction register 210 determines which register is fed by TDI for a given operation.

The IC 200 also includes a clock shaper 216 that is configured to perform clock shaping on the TCK signal for providing an output clock signal to the boundary scan chain. As described herein, clock shaper 216 can include a delay network configured to delay an inverted TCK signal as to provide the output clock signal TCK_OUT. By selectively controlling the amount of delay (e.g., incrementally increased or decreased) the clock shaper 216 can provide a variable adjustment to the rising edge of the output TCK signal to facilitate capture of a state change during a speed test according to an aspect of the invention. An example embodiment of the clock shaper 216 is shown and described with respect to FIG. 4. The TDO pin is the serial data output for all JTAG instruction and data registers. The state of the TAP controller as well as the particular instruction held in the instruction register determines which register feeds TDO for a specific operation. For example, the TDO pin can be employed to access the output of a FF or other storage element of a selected BSC 202 during a speed test for use in characterizing the I/O path as described herein.

FIG. 6 depicts an example of a JTAG state machine 250 and how its operation can be modified to perform at-speed testing according to an aspect of the present invention. As discussed with the example of FIG. 5, the state machine 250 is controlled by the TCK and TMS inputs. For instance, these two inputs determine whether an instruction register scan or data register scan is performed. The state machine 250 consists of a small controller design, driven by the TCK input, which responds to the TMS input as shown in the state diagram in FIG. 6.

For the data register path of the state machine, there are shown the following steady states: Run-Test/Idle (RTI), Shift-DR (SDR), and Pause-DR (PDR). At power up, or during normal operation of the host IC, the TAP is forced into the Test-Logic-Reset state by driving TMS high and applying five or more TCKs. In this state, the TAP issues a reset signal that places all test logic in a condition that does not impede normal operation of the host IC. When test access is required, a protocol is applied via the TMS and TCK inputs, causing the TAP to exit the Test-Logic-Reset state and move through the appropriate states.

The RTI state allows certain operations to occur depending on the current instruction that is loaded into the instruction register. From the Run-Test/Idle state, a data register scan can be issued to transition the state machine 250 through the appropriate states shown in FIG. 3. For simplicity of explanation the states associated with the instruction register scan have been omitted.

By way of example, SEL_DR scan state can be entered prior to performing a scan operation on a data register or in passing to the Select-IR scan state. From the SEL_DR scan state, the state machine 250 can transition to the CDR state (at TMS=0), which allows data to be loaded from parallel inputs into the data register selected by the current instruction on the rising edge of TCK. The capture occurs on rising edge of the output TCK signal provided by the clock shaper. According to an aspect of the invention, the normal operation of loading the parallel inputs into the data register can be inhibited when a predefined instruction, the ASCAP instruction, is loaded into the instruction register. For example, the clock shaper can cause the rising edge of the TCK to incrementally vary to ascertain timing requirements for propagating a signal through the I/O path. The timing requirements can be determined in according to the time required to detect a state transition at the output of flip-flop in the BSC such as described herein. From CDR state, the state machine transitions to the SDR state (at TMS=0) or it can transition to the Exit1-DR (X1DR) state (at TMS=1).

The SDR state shifts the data, in the currently selected register, towards TDO by one stage on each rising edge of the output TCK after entering this state. The state machine 250 can transition from the SDR to the X1DR state depending on the TMS input (at TMS=1). The X1DR state is a temporary state that allows the option of passing on to the Pause-DR (PDR) state (at TMS=0) or transitioning directly to the Update-DR state (at TMS=1). The PDR state is a wait state that allows shifting of data to be temporarily halted. The state machine can remain in PDR (at TMS=0) or transition to the Exit2-DR (X2DR) state (at TMS=1). The X2DR state is a temporary state that allows the option of passing on to the UDR state (at TMS=1) or returning to the SDR state (at TMS=0) to continue shifting in data depending on the value of the TMS input. The UDR state causes the data contained in the currently selected data register to be loaded into a latched parallel output (for registers that have such a latch) on the falling edge of TCK after entering this state. The parallel latch prevents changes at the parallel output of these registers from occurring during the shifting process. According to an aspect of the invention, the normal operation performed during the UDR state can be inhibited while the ASCAP instruction is loaded into the instruction register. From the UDR state, the state machine can resume the data register operations by returning to the SEL_DR state (at TMS=1) or operations can be terminated by entering the RTI state (at TMS=0).

Figure 7:
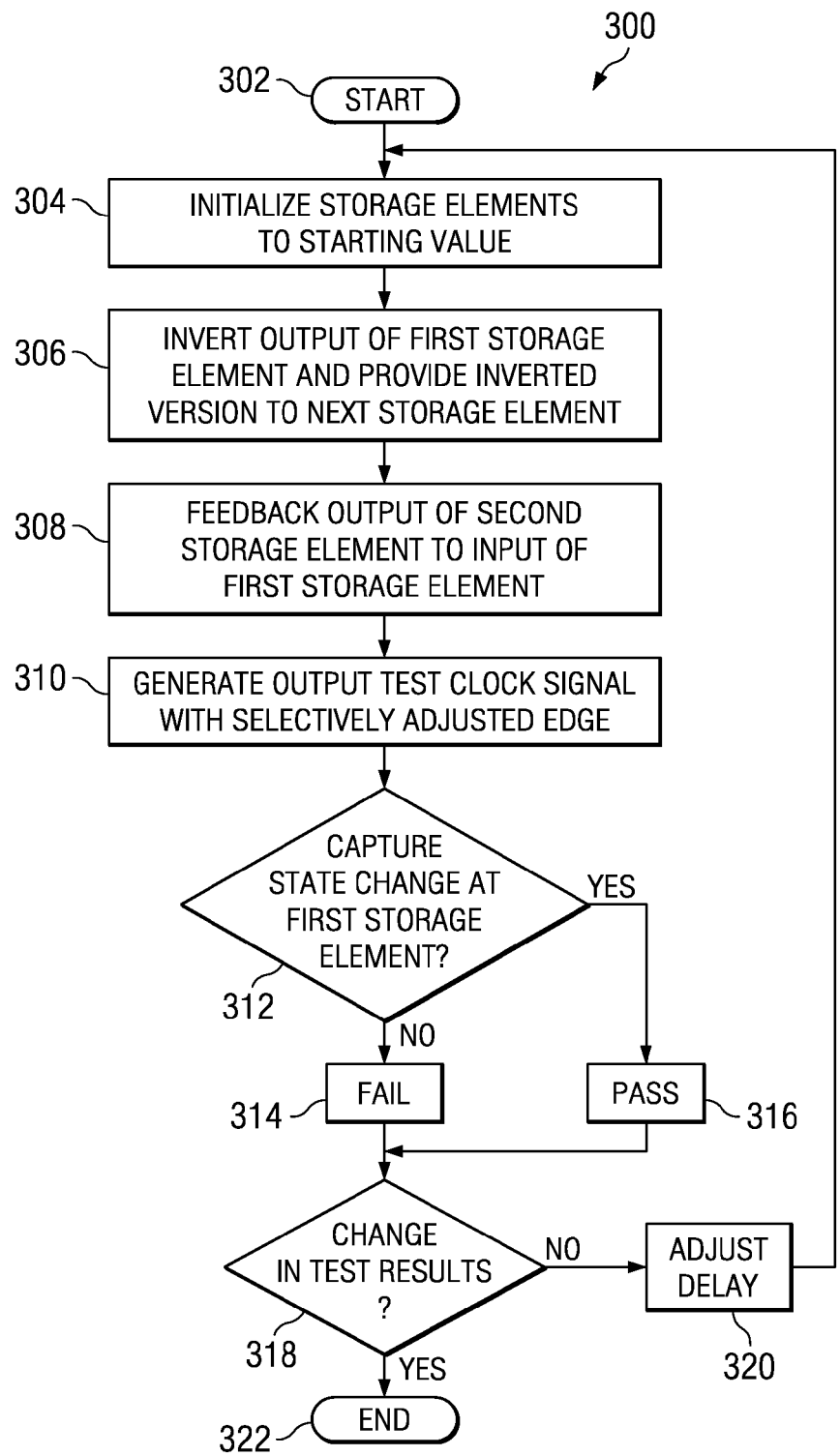
FIG. 7 depicts an example of a method for performing a test in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates a method 300 for input/output characterization of a JTAG-compliant integrated circuit. The method 300 begins at 302 such as in response to entering a predefined test mode, such as the ASCAP mode while in the RTI state of the JTAG state machine. At 304, first and second storage elements can be initialized to a desired starting value. The first storage element and the second element can be connected in series between an input and an output of a BSC. It is to be appreciated that the method 300 can be performed with respect to any number of one more BSCs in the JTAG-compliant IC, such as shown and described herein At 306, an output of the first storage element is inverted and the inverted output is provided (either directly or through other circuitry) to an input of the second storage element in response to entering a predefined test mode. At 308, an output of the second storage element is fed back to an input of the second storage element. For example, the output can be fed back by a bidirectional element that is connected between the output of the second storage element and a pad of the IC. At 310, an output test clock signal is generated with a selectively adjustable edge during the predefined test mode (e.g., the ASCAP mode). For example, the output test clock signal can be provided by incrementally adjusting an amount of delay on an inverted version of an input test clock signal to provide a selectively delayed inverted test clock signal. The delayed and inverted version of the test clock signal can be logically ORed with the test clock signal to provide the incrementally adjusted test clock signal. The amount of delay, for example, can be adjusted by incrementing or decrementing a counter in the IC. It will be appreciated that the output clock signal can be provided with either a selectively adjustable rising edge or a selectively adjustable falling edge during the predefined test mode, such as may depend on the configuration of the IC. An adjustable rising edge can be used for capturing the output of a CDR for a JTAG compliant device. If the device were not strictly JTAG compliant, a different edge (i.e., a falling edge) could be utilized for I/O testing similar to that described herein.

At 312, a determination is made as to whether a state change at the output of the first storage element is captured in response to the output test clock signal. If a state change is not detected (NO), the test can be considered to fail, as indicated at 314, since the signal did not propagate through the circuit within a given TCK cycle. If a state change is detected (YES), the test can be considered to pass the test, indicated at 316. At 318, a determination can be made to determine if there is change in the test results from a preceding test. If the results do not change (NO), the method can proceed to 320 in which the amount of delay can be adjusted, such as by incrementing or decrementing a counter. From 320, the method can return to 304 to repeat the test (from 304-318) for the next delay value. If there is a change in the current test results from the preceding test results, the method can proceed from 318 to 322 where the method ends. A change in the test results between two consecutive tests (e.g., from a pass to a fail, or from a fail to a pass) can be used to characterize the timing for a given pad of the IC or for each pad in the IC. A determination of such I/O timing can be determined from an external test system or internally in the IC based on the amount of delay implemented by a delay line, such as can depend on a counter value (see, e.g., FIG. 4). Due to the incremental adjustments utilized to generate the output test clock signal, the state change at the output of the first storage element can be captured within one cycle of the test clock signal. In view of the foregoing, it will be appreciated that speed tests and other I/O characterization can be implemented in a JTAG-compliant IC at little additional cost, such as the cost associated with adding initialization logic (e.g., an XOR gate).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A test system in an integrated circuit, the test system comprising:
    a boundary scan cell comprising:
        a first storage element;
        a second storage element connected in series with the first storage element; and
        initialization logic connected between an output of the first storage element and an input of the second storage element, the initialization logic providing the output of the first storage element to the input of the second storage element unchanged during a first operating state, and providing an inverted version of the output of the first storage element to the input of the second storage element during a second operating state; and
    a bi-directional element connected to receive an output of the second storage element, the bi-directional element feeding the output of the second storage element to an input of the first storage element, such that capture of a state change at the output of the first storage element at the output of the first storage element is facilitated during the second operating state.

2. The test system of claim 1, further comprising a clock shaping system configured to provide an output clock signal, the output clock signal corresponding to a test clock signal during the first operating state and corresponding to the test clock signal having a selectively adjustable rising edge during the second operating state to enable capture of the state change at the output of the first storage element within one test clock cycle.

3. The test system of claim 2, wherein the clock shaping system further comprises a delay network that implements an incremental amount of delay on an inverted version of the test clock signal to provide the adjustable rising edge of the test clock signal during the second operating state.

4. The test system of claim 3, further comprising a counter that provides a counter value that is incremented to select the incremental amount of delay implemented by the delay network.

5. The test system of claim 1, wherein the second operating state is entered into in response to a predetermined test instruction being loaded into an instruction register during a run test idle state of a state machine being inhibited during the second operating state.

6. The test system of claim 4, wherein the integrated circuit further comprises a JTAG test access port controller having a plurality of states, normal activities during at least one of an Update-DR state and a Capture-DR state of the JTAG test access port controller.

7. The test system of claim 1, wherein the initialization logic comprises an Exclusive-OR gate having a first input connected with the output of the first storage element and a second input that receives a mode signal that defines at least one of the first operating state and the second operating state.

8. The test system of claim 6, wherein the second operating state defines an at speed capture mode designed for characterizing a length of time required for propagation of a signal to one of an input and an output of the integrated circuit.

9. The test system of claim 1, further comprising a plurality of the boundary scan cells connected in series to define a boundary scan chain of the integrated circuit, the integrated circuit being a JTAG-compliant integrated circuit, further comprising an interface for controlling the operating state of each of the plurality of boundary scan cells and for evaluating the output of the first storage element for at least one of the plurality of boundary scan cells.

10. The test system of claim 9, wherein the interface further comprises a JTAG test access port controller having a plurality of test states, normal activities during at least one of an Update-DR state and a Capture-DR state of the JTAG test access port controller being inhibited during the second operating state to facilitate capture of the state change at the output of the first storage element.

11. A test system in a JTAG-compliant integrated circuit, the test system comprising:
    a first storage element;
    a second storage connected in series with the first storage element;
    a bi-directional element connected between an output of the second storage element, the bi-directional element feeding an output of the second storage element to an input of the first storage element;
    initialization logic connected between the first storage element and the second storage element, the initialization logic being configured to pass the output of the first storage element to the input of the second storage element during a first operating state and being configured to provide an inverted version of the output of the first storage element to the input of the second storage element during a second operating state; and
    a clock shaping system configured to provide an output clock signal to control shifting data through at the first and second storage elements, the output clock signal corresponding to a test clock signal having a substantially fixed duty cycle during the first operating state, the output clock signal corresponding to the test clock signal having one of a selectively adjustable rising edge or falling edge during the second operating state to enable capture of a state change at the output of the first storage element during the second operating state.

12. The test system of claim 11, wherein the JTAG compliant integrated circuit comprises a plurality of boundary scan cells, each of the plurality of boundary scan cells comprising one of the first storage element and one of the second storage element connected in series with the initialization logic connected between an output of the first storage element and an input of the second storage element.

13. The test system of claim 12, wherein the JTAG compliant integrated circuit further comprising an interface for controlling the operating state of each of the plurality of boundary scan cells and for evaluating the output of the first storage element for at least one of the plurality of boundary scan cells.

14. The test system of claim 13, wherein the interface further comprises a JTAG test access port controller having a plurality of test states, normal activities during at least one of an Update-DR state and a Capture-DR state of the JTAG test access port controller being inhibited during the second operating state to facilitate capture of the state change at the output of the first storage element.

15. The test system of claim 11, wherein the clock shaping system further comprises a delay network that implements an incremental amount of delay on an inverted version of the test clock signal that is logically ORed with the test clock signal to provide the output clock signal with the one of a selectively adjustable rising edge or falling edge during the second operating state.

16. The test system of claim 15, further comprising a counter that provides a counter value that is incremented to select the incremental amount of delay implemented by the delay network.

17. The test system of claim 11, wherein the second operating state is entered into in response to a predetermined test instruction being loaded into an instruction register of the JTAG compliant integrated circuit during a run test idle state of a state machine being inhibited during the second operating state.

18. The test system of claim 11, wherein the initialization logic comprises a logic gate having a first input connected with the output of the first storage element and a second input that receives a mode signal that defines at least one of the first operating state and the second operating state, the logic gate being configured to invert the output of the first storage element when the mode signal indicates the second operating state.

19. A method for input/output characterization of a JTAG-compliant integrated circuit, the method comprising:
    initializing at least a first storage element and a second storage element to a starting value, the first storage element and the second element being connected in series between an input and an output of a boundary scan cell;
    inverting an output of the first storage element and providing the inverted output to an input of the second storage element in response to entering a predefined test mode;
    feeding back an output of the second storage element to an input of the first storage element;
    incrementally adjusting a test clock signal during the predefined test mode; and
    capturing a state change at the output of the first storage element in response to the incrementally adjusted test clock signal causing the inverted output of the first storage element to be fed back to the second storage element within one cycle of the test clock signal.

20. The method of claim 19, further comprising:
    incrementally adjusting an amount of delay on an inverted version of the test clock signal to provided a selectively delayed inverted test clock signal; and
    logically ORing the selectively delayed inverted test clock signal with the test clock signal to provide the incrementally adjusted test clock signal with the one of a selectively adjustable rising edge or falling edge during the predefined test mode.

* * * * *